(12) United States Patent
Zoellin et al.

(10) Patent No.: US 8,816,453 B2
(45) Date of Patent: Aug. 26, 2014

(54) MEMS COMPONENT AND A SEMICONDUCTOR COMPONENT IN A COMMON HOUSING HAVING AT LEAST ONE ACCESS OPENING

(75) Inventors: Jochen Zoellin, Stuttgart (DE); Ricardo Ehrenpfordt, Korntal-Muenchingen (DE); Ulrike Scholz, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/454,911

(22) Filed: Apr. 24, 2012

(65) Prior Publication Data
US 2012/0280335 A1    Nov. 8, 2012

(30) Foreign Application Priority Data
May 4, 2011    (DE) .......................... 10 2011 075 260

(51) Int. Cl.
| | |
|---|---|
| H01L 29/84 | (2006.01) |
| B81B 7/00 | (2006.01) |
| B81B 3/00 | (2006.01) |
| B81B 7/02 | (2006.01) |
| H01L 25/16 | (2006.01) |
| H04R 19/04 | (2006.01) |
| B81C 1/00 | (2006.01) |
| H01L 23/00 | (2006.01) |

(52) U.S. Cl.
CPC ......... *B81B 3/00* (2013.01); *H01L 2224/32225* (2013.01); *H01L 24/73* (2013.01); *B81B 2207/015* (2013.01); *B81B 7/0061* (2013.01); *H01L 24/48* (2013.01); *H01L 2924/15151* (2013.01); *H01L 2924/1433* (2013.01); *B81B 7/02* (2013.01); *H01L 2224/32145* (2013.01); *H01L 24/32* (2013.01); *H01L 2224/48225* (2013.01); *H01L 2924/1461* (2013.01); *B81B 2201/0257* (2013.01); *H01L 25/16* (2013.01); *H04R 19/04* (2013.01); *B81C 1/0023* (2013.01); *H01L 2924/16151* (2013.01); *H01L 2924/18161* (2013.01); *H01L 2224/73265* (2013.01)
USPC ............................................. 257/416; 438/53

(58) Field of Classification Search
CPC .......... H01L 2224/32145; H01L 2224/32225; H01L 2224/48225; H01L 24/32; H01L 24/73; H01L 25/16; H01L 2924/1433; H01L 2924/1461; H01L 2924/15151; H01L 2924/16151; H01L 2924/18161; B81C 1/0023; H04R 19/04; B81B 2201/0257; B81B 2207/015
USPC ...................................... 257/415–420; 438/53
See application file for complete search history.

(56) References Cited

U.S. PATENT DOCUMENTS

2005/0186703 A1 * 8/2005 Weiblen et al. ............... 438/106
(Continued)

FOREIGN PATENT DOCUMENTS

| | | |
|---|---|---|
| DE | 10 2005 053 765 | 5/2007 |
| DE | 10 2007 008 518 | 8/2008 |
| DE | 10 2010 006 132 | 8/2011 |

*Primary Examiner* — Shaun Campbell
(74) *Attorney, Agent, or Firm* — Kenyon & Kenyon LLP (57) ABSTRACT

A component includes at least one MEMS component and at least one additional semiconductor component in a common housing having at least one access opening. On the front side of the MEMS component, at least one diaphragm structure is provided, which spans a cavity on the backside of the MEMS component. The housing includes a carrier, on which the MEMS component is mounted. The MEMS component is mounted, using its front side, on the carrier, so that there is a standoff between the diaphragm structure and the carrier surface. The at least one additional semiconductor component is connected to the backside of the MEMS component, so that the MEMS component and the semiconductor component form a chip stack.

10 Claims, 7 Drawing Sheets

(56) References Cited

U.S. PATENT DOCUMENTS

2008/0197485 A1* 8/2008 Theuss et al. .................. 257/723
2008/0315333 A1 12/2008 Combi et al.
2009/0001553 A1* 1/2009 Pahl et al. ..................... 257/704
2010/0284553 A1* 11/2010 Conti et al. .................... 381/174

* cited by examiner

MEMS COMPONENT AND A SEMICONDUCTOR COMPONENT IN A COMMON HOUSING HAVING AT LEAST ONE ACCESS OPENING

BACKGROUND OF THE INVENTION

1. Field of the Invention

The present invention relates to a component having at least one MEMES component and at least one additional semiconductor component, which are situated in a common housing having at least one access opening; on the front side of the MEMES component, at least one diaphragm structure is developed which spans a cavity in the backside of the MEMS component; and the housing includes a carrier on which the MEMS component is mounted.

2. Description of the Related Art

In practice, such carriers or substrate-based housings are used for packaging MEMS microphone components. In this case, the microphone chip is mounted on a carrier, using chip-on-board (COB) technology, contacted electrically and housed using a cover. Usually, the microphone chip is mounted with its backside on the carrier, so that the cavity below the diaphragm structure is closed by the carrier. If the sound opening is located in the housing cover, the cover functions below the diaphragm structure as a backside volume, while the housing cavity forms the front volume.

This type of packaging is not only used for integrated CMOS MEMS but also for packaging of a plurality of chips if, for example, the micromechanical microphone structure is implemented on a MEMS and the signal evaluation is wholly or partially implemented on a separate ASIC. In this case, the chips are positioned next to one another on the carrier, so that the area overhead of the component in total, as a ratio to the area of the MEMS chip, is relatively large.

BRIEF SUMMARY OF THE INVENTION

The present invention provides measures which enable a cost-effective and space-saving implementation of a component of the type named at the outset.

According to the present invention, this is achieved in that the MEMS component is mounted using its front side on the carrier, so that there is a distance between the diaphragm structure and the carrier surface, and that the at least one additional semiconductor component is connected to the backside of the MEMS component, so that the MEMS component and the semiconductor component form a chip stack.

In deviation from the side-by-side chip arrangement known from the related art, the packaging concept according to the present invention is based on a stacked arrangement of semiconductor component and MEMS component, whereby the lateral dimensions of the component may be clearly reduced. Furthermore, the packaging concept according to the present invention provides a flip-chip mounting of the MEMS component on the carrier. Using this connecting technology, the MEMS component is able to be mechanically fixed very simply at a standoff from the carrier surface, so that the diaphragm function of the MEMS component is assured. In addition, flip-chip mounting enables an extremely space-saving electrical contacting of the MEMS component. Based on the face-down orientation of the MEMS component, the carrier forms a mechanical protection for the front side of the component having the micromechanical diaphragm structure. The backside of the MEMS component having the cavity is at least partially covered by the additional semiconductor component, and is thus protected from negative environmental influences. All in all, the packaging concept according to the present invention offers very great flexibility, as far as the type, form and material of the housing are concerned, as well as the positioning of the front and back volumes.

The additional semiconductor component, depending on the function of the component according to the present invention and the type of the MEMS component, may be a chip having or not having electrical functionality. Since mechanical patterning processes are not just simply compatible with the CMOS process, it frequently turns out to be advantageous to separate the mechanical and the electrical functionality to chip level. For this reason, in one preferred specific embodiment of the component according to the present invention, the additional semiconductor component is an ASIC. This may be simply connected backside to backside to the MEMS component. In that case, the electrical contacting of the ASIC preferably takes place with the aid of bonding wires. However, the ASIC may also be mounted on the backside of the MEMS component with its active front side, on which the metallized pads are situated for electrical contacting. In this case, the electrical contact to the carrier is made via plated-through contacts in the MEMS component, in combination with flip-chip mounting.

Because of the connection to the MEMS component, the additional semiconductor component is in a stable insertion position, which is relatively far from the carrier. In addition, the semiconductor component and the carrier are relatively well mechanically decoupled, based on the flip-chip mounting of the MEMS component. Because of that, a thermomechanically conditioned bending of the semiconductor component is largely prevented. This is of advantage particularly in the case of ASIC's, since in this case mechanically conditioned strains in the component are able to lead to an undesired signal drift.

Even without the additional semiconductor component being outfitted with an independent micromechanical function, in composite action with the MEMS component, a mechanical function may involve it. Thus, for example, the backside cavity of the MEMS component may be closed in a pressure-tight manner with the aid of the semiconductor component, in order to implement a reference volume for absolute pressure measurements or even a backside volume for a microphone function.

However, with the aid of the additional semiconductor component, a defined access or pressure connection to the backside of the diaphragm structure may be created, for instance, when the semiconductor component has a smaller chip area than the MEMS component and/or is situated offset to it, so that the semiconductor component spans the backside cavity of the MEMS component only partially. Alternatively, however, the semiconductor component may also be provided with at least one through hole, which is situated so that it opens out into the backside cavity of the MEMS component. For this, methods such as trenching are available, using which, the dimensions and also the positions of through holes are able to be specified very accurately. Thereby very small through holes are able to be implemented, having a diameter in the pm range.

The through hole of the component housing may be developed either in the carrier or in another housing part.

In one specific embodiment of the present invention, beside the carrier, the housing includes a cover part positioned over the chip stack and is connected to the carrier in a circumferentially pressure-tight manner. Such a cover part may be adapted very simply in material, shape and size, to the application-specific requirements of the component. As an example, we mention here a component having a MEMS microphone component. The microphone performance is able to be substantially affected by the embodiment of the cover part, since the housing cover codetermines the size ratios of front and backside volumes. In this application, it proves advantageous if the sound opening in the cover part is connected pressure-tight to a through hole in the semiconductor component, so that the backside of the diaphragm structure is acted upon by the sonic pressure, and only the backside cavity of the MEMS component functions as a front volume, while the comparatively large housing cavity between the carrier and the cover part is connected to the front side of the diaphragm structure and is available as a backside volume.

However, the housing may also be implemented in the form of a molded housing. In this case, the MEMS component and the semiconductor component are at least partially bound up in a molding compound, so that there is a cavity between the diaphragm structure of the MEMS component and the carrier surface. This variant is particularly suitable for applications in which the size of the housing cavity is not important to the performance of the MEMS component. In order to keep the diaphragm structure free on the carrier side, the molding compound flow may be simply limited by a sealing ring or underfiller in the area of the flip-chip contacting.

In one advantageous specific embodiment of this packaging variant, the access opening is located in the carrier underneath the diaphragm structure of the MEMS component, and the backside cavity is closed by the semiconductor component. In this case, no special molding tool is required for embedding the MEMS component and the semiconductor component, together perhaps with bonding wires, in the molding compound for contacting. However, the contact opening may also be developed in the molding compound, in order to open out in the backside cavity of the MEMS component via a through hole in the semiconductor component. For this purpose, the access opening has to be kept free during the molding process. The appropriate tool may be put directly onto the semiconductor component if the latter does not include any fragile structures. The occurrence of a molding flash is also noncritical in this case, as long as an access opening in the molding compound and the through hole in the semiconductor component remain free. The sensitivity of the diaphragm structure of the MEMS component is not impaired thereby, in any case. In this embodiment variant, the standoff between the diaphragm structure and the carrier is used as a back volume.

The packaging concept according to the present invention is very suitable for the first-level packaging of MEMS microphone components, but is not limited to this application.

DETAILED DESCRIPTION OF THE INVENTION

In the figures, the same reference numerals are used for the same components of the component design.

All the exemplary embodiments refer to a component having a MEMS microphone component 1 and an ASIC 2 as the additional semiconductor component. At the front side of microphone component 1 there is developed a diaphragm structure 3 having means for signal detection, which are contacted via four connection pads 5 on the front side of microphone component 1. Diaphragm structure 3 spans a cavity 4 in the component backside.

Microphone component 1 is mounted in flip-chip technique, that is, using its front side on a carrier 11, so that there is a gap between diaphragm structure 3 and the carrier surface (standoff). Carrier 11 may, for example, be a printed circuit board substrate in the form of a multi-panel substrate. The solder flip-chip technique is particularly suitable as mounting technique. However, adhesion flip-chip technique may also be used.

ASIC 2 is situated on the backside of microphone component 1, so that the two components 1 and 2 form a chip stack. In all the exemplary embodiments shown here, components 1 and 2 are connected to each other via a patterned adhesive layer 7.

Figure 1A:
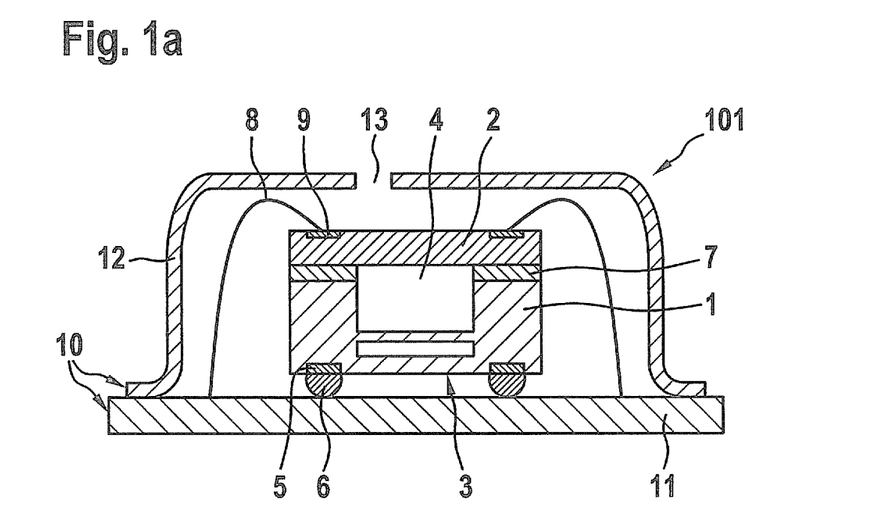
FIG. 1a shows a schematic sectional representation of a component 101 according to the present invention, having an access opening in the housing cover.
Figure 1B:
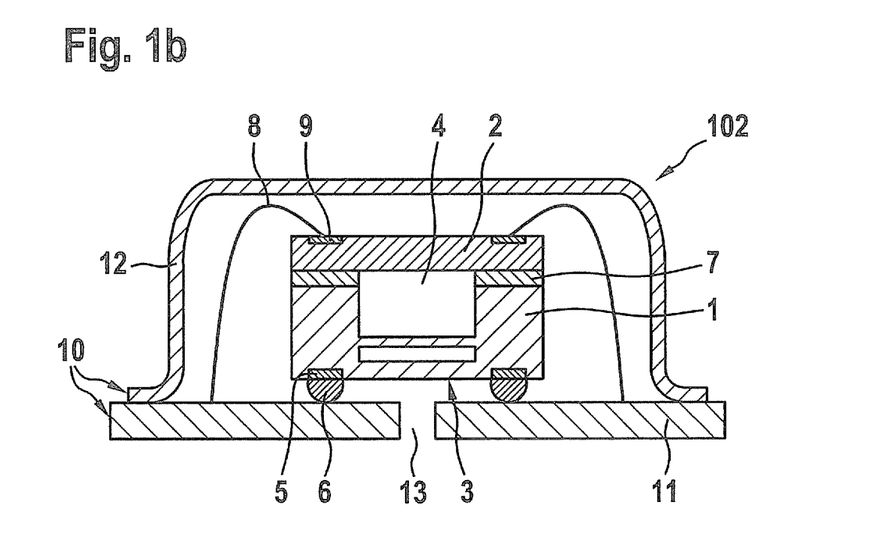
FIG. 1b shows a schematic sectional representation of a component 102 according to the present invention, having an access opening in the carrier.
Figure 1C:
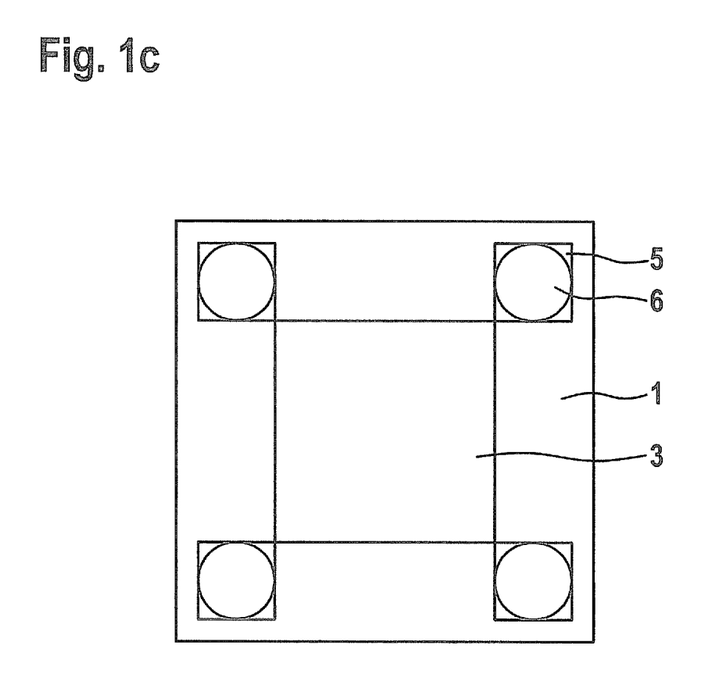
FIG. 1c shows a schematic top view onto the mounting side of the MEMS component of components 101 and 102.

In the case of components 101 and 102, both the mechanical and the electrical connection between microphone component 1 and carrier 11 are produced via four solder balls 6 on connection pads 5. The positioning of connection pads 5 and solder balls 6 at the four corners of diaphragm area 3 is illustrated in FIG. 1c. According to that, microphone component 1 is connected, in this case, not all the way around but only punctually to carrier 11.

In the case of components 101 and 102, microphone component 1 and ASIC 2 are connected to each other backside to backside. Since ASIC 2 has essentially the same lateral dimensions as microphone component 1 and is situated flush with it, ASIC 2 spans backside cavity 4 and closes it tightly acoustically. The electrical contacting of ASIC 2 takes place via bonding wires 8, which are guided from corresponding bonding pads 9 on the active front side of ASIC 2 to carrier 11.

Both components 101 and 102 include a cover part 12, which is situated over chip stack 1, 2, and is connected pressure-tight circumferentially to carrier 11, so that carrier 11 and cover part 12 form a housing 10 for microphone component 1 and ASIC 2. In the case of component 101, FIG. 1a, sound opening 13 is developed in cover part 12, and in the case of component 102, FIG. 1b, in carrier 11. Since the front side of microphone component 1 is in both cases only connected punctually to carrier 11, there exists both in component 101 and in component 102 a pressure connection between the front side of diaphragm structure 3 and the housing cavity. Accordingly, in both cases, the front side of diaphragm structure 3 has sonic pressure applied to it. In this context, the entire housing cavity functions as a front volume, whereas acoustically tightly closed backside cavity 4 of microphone component 1 acts as a backside volume.

Figure 2A:
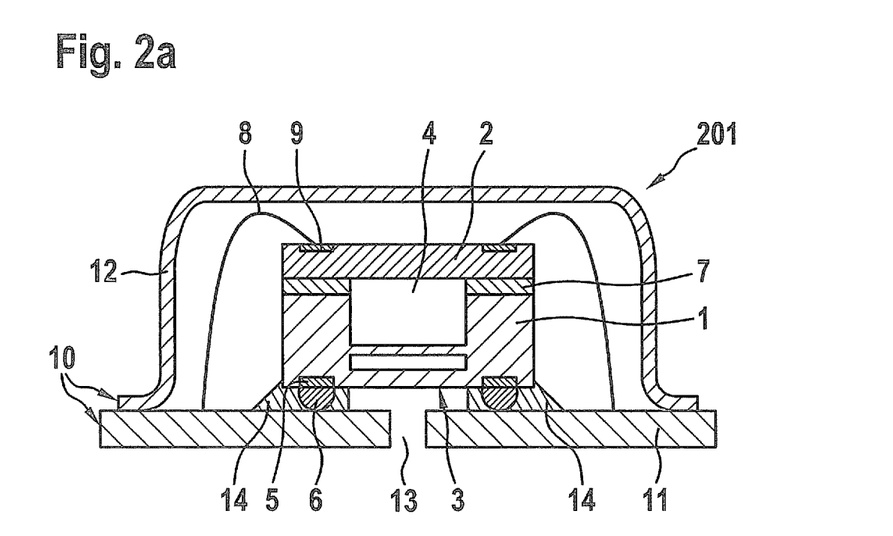
FIGS. 2a and 2b illustrate two variants for a pressure-tight mounting the MEMS component on the carrier with reference to sectional representations of two components 201 and 202.
Figure 2B:
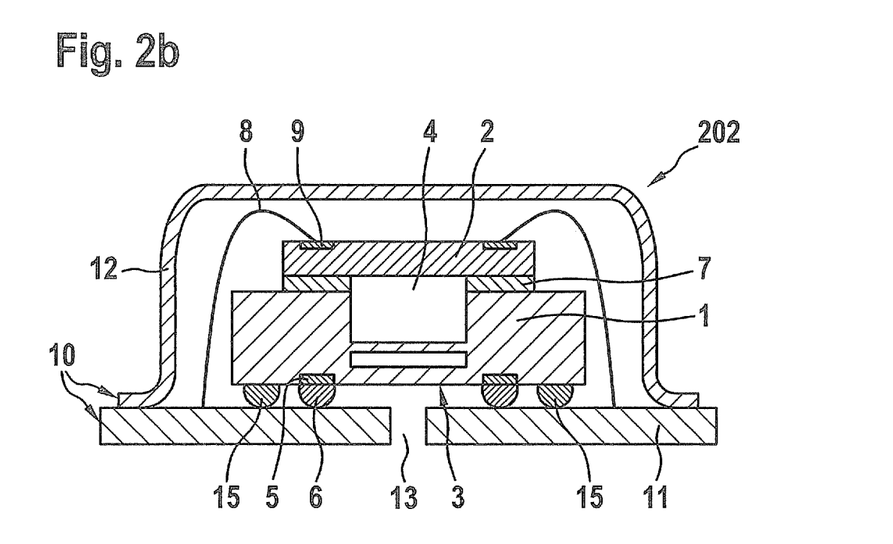

Components 201 and 202, shown in FIGS. 2a and 2b, differ from component 102, shown in FIG. 1b, only in the mounting of microphone component 1 on carrier 11. In order to avoid repetition, the subsequent description is limited to this aspect.

As in the case of FIG. 1, microphone component 1 of components 201 and 202 is mounted on carrier 11 in flip-chip mounting, so that diaphragm structure 3 is situated over sound opening 13 in carrier 11, and a standoff exists between diaphragm structure 3 and the carrier surface. Here too, the mechanical and electrical, connecting between microphone component 1 and carrier 11 is produced via the four connection pads 5 on the front side of microphone component 1 and the four correspondingly situated solder balls 6. However, in this case the space between microphone component 1 and the carrier surface was still circumferentially sealed, so as to limit the front volume and thus to improve the microphone performance.

In the case of FIG. 2a, the sealing was implemented with the aid of an electrically non-conductive adhesive (underfiller) 14, which was applied circumferentially around diaphragm region 3 between the front side of microphone component 1 and the carrier surface, so that solder contacts 5, 6 of the flip-chip contacting are embedded in underfiller 14.

In the case of FIG. 2b, a circumferential solder ring 15 is used as the seal, whose extension is limited to the region of a corresponding pad ring on the surface of microphone component 1. This sealing ring 15 surrounds diaphragm region 3, in the exemplary embodiment shown here, and solder contacts 5, 6 of the flip-chip contacting, but may also be situated between diaphragm region 3 and solder contacts 5, 6, depending on the design of the pad rings.

As was mentioned before, in the case of components 201 and 202 shown in FIGS. 2a and 2b, the sealed space between the front side of microphone component 1 and the carrier surface is used as front volume, while acoustically tightly closed backside cavity 4 of microphone component 1 acts as backside volume. By contrast to this, in FIGS. 3a and 3b, two component 301 and 302 are shown, in which ASIC 2 is patterned or mounted in such a way that backside cavity 4 is connected to the housing cavity, and functions as backside volume together with the housing cavity. The following description of the figures is limited to this aspect, since the construction of components 301 and 302 otherwise corresponds to that of component 201 shown in FIG. 2a.

Figure 3A:
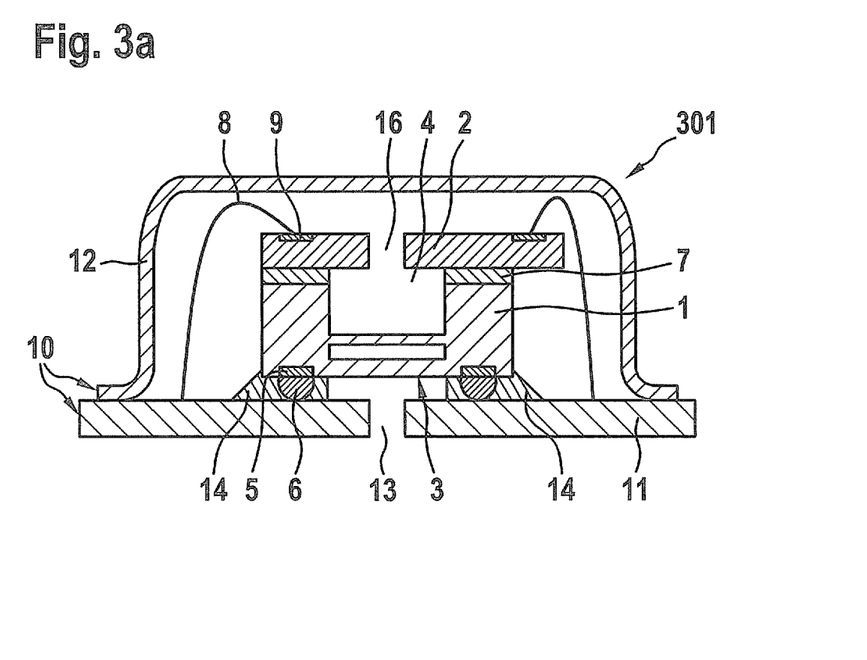
FIGS. 3a and 3b each show a schematic sectional representation of a component 301 and 302, in which the backside cavity of the MEMS component is connected to the housing cavity.

In the case of component 301, the chip area of ASIC 2 is clearly greater than that of microphone component 1. ASIC 2 is positioned so that it spans the entire backside with backside cavity 4 of microphone component 1. However, in the center region of ASIC 2 a through hole 16 is formed, via which backside cavity 4 is connected to the housing cavity between cover part 12 and carrier 11.

Figure 3B:
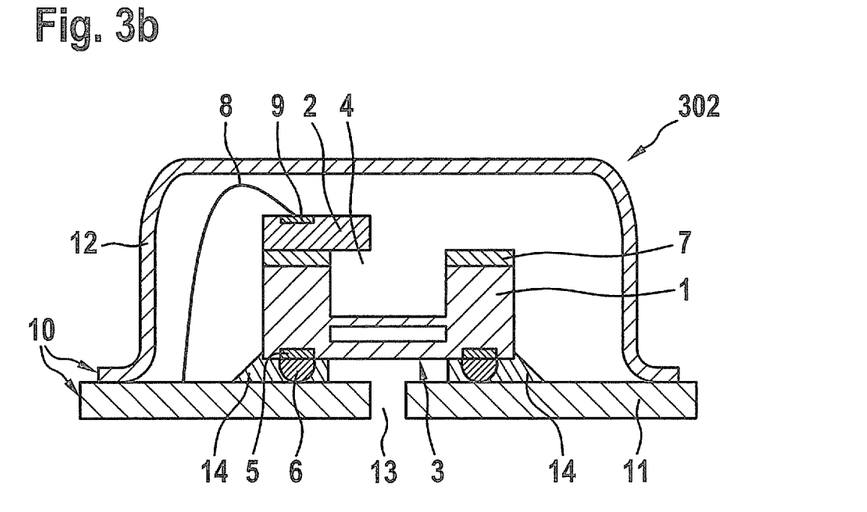

In the case of component 302, the chip area of ASIC 2 is clearly less than that of microphone component 1. In this case, ASIC 2 is positioned on the backside of microphone component 1 in such a way that it only covers a part of the backside cavity, but does not close it off, so that backside cavity 4 is connected to the housing cavity between cover part 12 and carrier 11.

Figure 4:
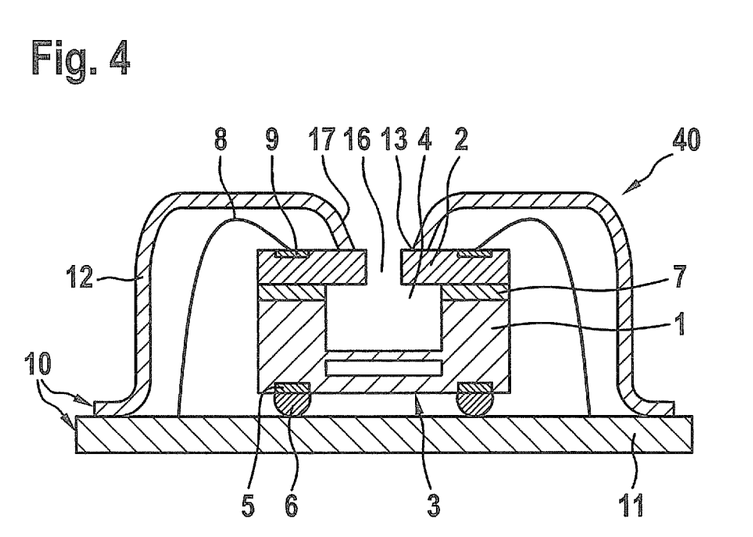
FIG. 4 shows a schematic sectional representation of a microphone component 40 according to the present invention.

Construction design 40 of a microphone component 40, shown in FIG. 4, is particularly advantageous, both with respect to microphone performance and with respect to the $2^{nd}$ level mounting of the component.

Microphone component 1 is fixed, in this case, punctually via four solder balls 6 on carrier 11, via which the electrical contacting of microphone component 1 also takes place.

ASIC 2 is connected to microphone component 1 backside to backside, so that it spans backside cavity 4 of microphone component 1. A through hole 16 is formed in ASIC 2, which opens out into backside cavity 4 of microphone component 1. The electrical contacting of ASIC 2 takes place via bonding wires 8, which are guided from corresponding bonding pads 9 on the active front side of ASIC 2 to carrier 11. Over the chip stack consisting of microphone component 1 and ASIC 2 and bonding wires 8, 9, a cover part 12 is situated, in which a connecting piece 17 having a sound opening 13 (direct port) is developed. While the outer edge of the cover part is connected circumferentially pressure-tight to carrier 11, the edge region of sound opening 13 is connected acoustically tight to the edge region of the through hole in ASIC 2. This connection, which is not shown in greater detail, may be implemented with the aid of an adhesive, sealing rings, silicone rings or a rubber-like material.

The application of sound to diaphragm structure 3 thus takes place in this case via connecting piece 17 using sound opening 13 and through hole 16 in ASIC 2, which form an acoustical access channel to backside cavity 4. This acts as a front volume, while the entire housing cavity between carrier 11 and cover part 12 functions as a backside volume, since the front side of microphone component 1 is connected only point-wise to carrier 11 and, as a result, a pressure connection exists between the front side of diaphragm structure 3 and the housing cavity.

The component variants, explained in connection with FIGS. 1 through 4, include in each case a housing 10 for microphone component 1 and ASIC 2, which is made up of carrier 11 and a cover part 12 connected to it in a pressure-tight manner. As an alternative to this, the component according to the present invention may also be provided with a molded housing 20, which is shown in FIGS. 5a to 5d. In order to ensure the functionality of diaphragm structure 3, the space between diaphragm structure 3 and the carrier surface must be kept free in the molding process. The sealing required for this of the connection between microphone component 1 and carrier 11 may be implemented simply with the aid of an underfiller 14 or even a sealing ring 15, as described in connection with FIGS. 2a and 2b.

The construction of component 501 shown in FIG. 5 corresponds to the situation shown in FIG. 2a, except for the cover part. For the implementation of a housing 20, chip stack 1, 2 has been molded, in this case, together with bonding wires 8, 9, using a molding compound 21. Since the connection between microphone component 1 and carrier 11 has been sealed before, with the aid of underfiller 14, the molding compound has not been able to advance into space 24 between diaphragm structure 3 and the carrier surface. This space 24, into which sound opening 13 opens out in carrier 11, now forms the front volume of microphone component 1, while backside cavity 4 that is closed off by ASIC 2 acts as the backside volume.

Figure 5A:
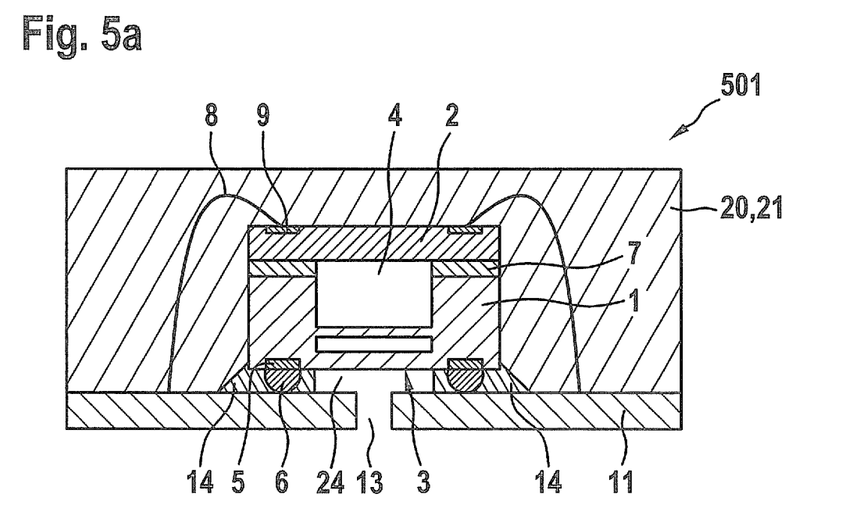
FIGS. 5a-5d show sectional representations of four components having a molded housing.
Figure 5B:
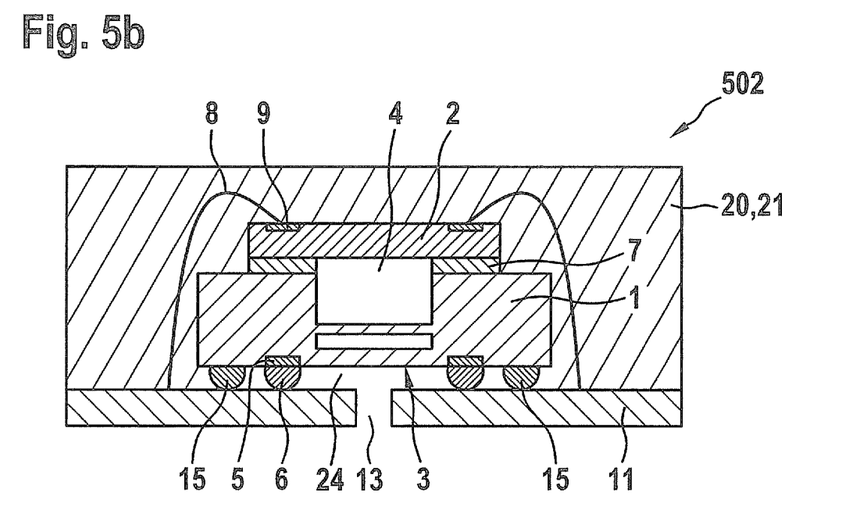

The construction of component 502 shown in FIG. 5b corresponds to the situation shown in FIG. 2b, except for the cover part. Space 24 between diaphragm structure 3 and carrier 11 has been sealed, in this case, with the aid of a sealing ring 15, in order to keep it and sound opening 13 in carrier 11 free of molding compound 21. As in the case of FIG. 5a, this space 24 functions as a front volume, while backside cavity 4, that is closed off by ASIC 2, forms the backside volume of microphone component 1.

Figure 5C:
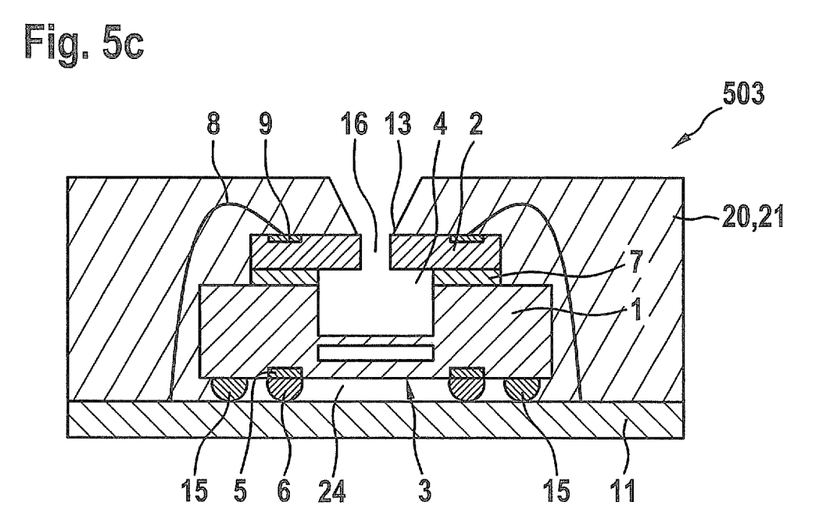

FIG. 5c shows a construction variant in which sound opening 13 is not located in carrier 11, but in molding compound 21, in which chip stack 1, 2 and bonding wires 8, 9 are embedded. In this case, sound opening 13 opens out into through hole 16 in ASIC 2, so that the backside of diaphragm structure 3 has the sound pressure applied to it. Accordingly, backside cavity 4 forms the front volume, while space 24 between diaphragm structure 3 and closed carrier 11, that is sealed with the aid of a sealing ring 15, is used as the backside volume.

To produce sound opening 13 in molding compound 21, and in order to keep through hole 16 in ASIC 2 free of molding compound 21, a punch-like molding tool was set in a sealing manner onto the upper side of ASIC 2, over through hole 16. For the tolerance adjustment between the tool and the ASIC surface, a special foil or a flexible tool coating may be used. In this way, a sound opening 13 is created in molded housing 20, which opens out into through hole 16 of ASIC 2. As molding compound 21, a suitable plastic compound is used, such as an epoxy compound filled with silicon oxide particles.

Figure 5D:
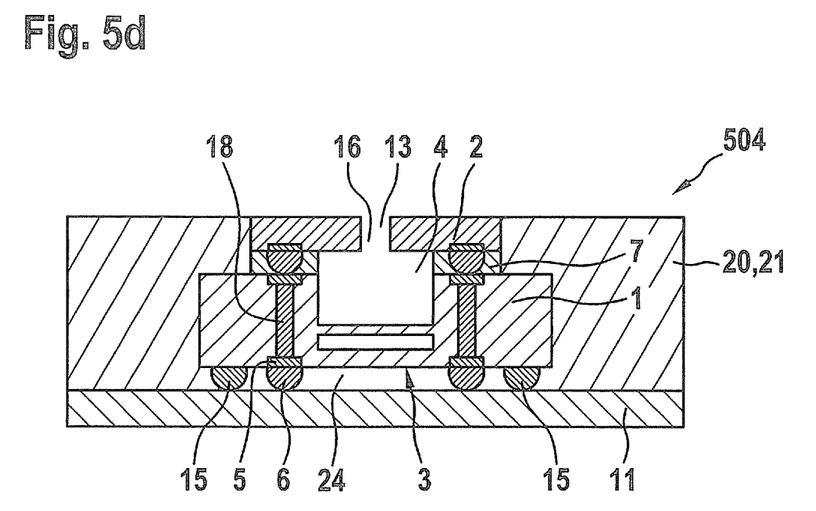

In the design variant shown in FIG. 5d, ASIC 2 has been mounted with its active front side on the backside of microphone component 1 and electrically contacted by through hole contacts 18 in microphone component 1 combined with flip-chip technology. Since the backside of ASIC 2 is insensitive to outer influences, molded housing 20 closes flush with the backside of ASIC 2, in this instance. In this case, during the molding process, the entire component backside of ASIC 2 is kept free of molding compound 21, to the greatest extent. In the process, sound opening 13 is also kept open, which in this case is implemented in the form of a through hole 16 in ASIC 2. The application of sound to diaphragm structure 3 accordingly takes place via backside cavity 4. Backside volume 24, between diaphragm structure 3 and carrier 11 is also sealed in this instance with the aid of a sealing ring 15.

What is claimed is:

1. A component comprising:
   at least one MEMS microphone component having at least one diaphragm structure developed on the front side, which spans a backside cavity;
   at least one additional semiconductor component (i) situated over the backside cavity of the MEMS microphone component and (ii) connected, at least in the edge region of the backside cavity, to the backside of the MEMS microphone component in a pressure-tight manner, such that the MEMS component and the semiconductor component form a chip stack;
   a carrier, on which the MEMS microphone component is mounted using its front side, so that there is a standoff between the diaphragm structure and the carrier;
   a cover part which is connected circumferentially to the carrier in a pressure-tight manner, and together with the carrier forms a housing having at least one sound opening for the MEMS microphone component and the additional semiconductor component;
   wherein:
   the at least one semiconductor component has a straight through hole to the cavity on the backside of the MEMS microphone component;
   the sound opening of the housing is provided in the cover part of the housing and is connected in a pressure-tight manner to the straight through hole in the at least one semiconductor component, so that the backside cavity of the MEMS microphone functions as the front volume of the MEMS microphone component; and
   the MEMS microphone component is mounted on the carrier in such a way that a housing cavity between the carrier and the cover part functions as the backside volume of the MEMS microphone component.

2. The component as recited in claim 1, wherein:
   the at least one additional semiconductor component is an ASIC;
   the backside of the ASIC is connected to the backside of the MEMS component; and
   electrical connection of the ASIC to the carrier is implemented via bonding pads on the front side of the ASIC and bonding wires.

3. The component as recited in claim 1, wherein:
   the at least one additional semiconductor component is an ASIC;
   the front side of the ASIC is connected using bonding pads for electrical connection to the backside of the MEMS component; and
   electrical connection of the ASIC to the carrier is implemented by through-hole-contacts in the MEMS component.

4. The component as recited in claim 3, wherein the MEMS component and the at least one semiconductor component are at least partially bound in a molding compound such that a further cavity is provided between the diaphragm structure of the MEMS component and the carrier surface.

5. The component as recited in claim 4, wherein the at least one access opening (i) is provided in the molding compound, and (ii) opens out via the through hole of ASIC into the cavity on the backside of the MEMS component.

6. A component comprising:
   at least one MEMS microphone component having at least one diaphragm structure developed on the front side, which spans a backside cavity;
   at least one additional semiconductor component (i) situated over the backside cavity of the MEMS microphone component and (ii) connected, at least in the edge region of the backside cavity, to the backside of the MEMS microphone component in a pressure-tight manner, so that the MEMS component and the semiconductor component form a chip stack;
   a carrier, on which the MEMS microphone component is mounted using its front side, so that there is a standoff between the diaphragm structure and the carrier;
   a cover part which is connected circumferentially to the carrier in a pressure-tight manner, and together with the carrier forms a housing having at least one sound opening for the MEMS microphone component and the additional semiconductor component;
   wherein:
   the at least one semiconductor component closes off the backside cavity of the MEMS microphone component in a pressure-tight manner, so that the cavity on the backside of the MEMS microphone component functions as the backside volume of the MEMS microphone component;
   the sound opening is provided in one of the cover part or the carrier; and
   the MEMS microphone component is mounted on the carrier in such a way that a housing cavity between the carrier and the cover part functions as the front volume of the MEMS microphone component: and
   wherein the MEMS microphone component and the additional semiconductor component are connected to each other via a patterned adhesive layer.

7. The component as recited in claim 6, wherein:
   the at least one additional semiconductor component is an ASIC;
   the backside of the ASIC is connected to the backside of the MEMS component; and
   electrical connection of the ASIC to the carrier is implemented via bonding pads on the front side of the ASIC and bonding wires.

8. The component as recited in claim 6, wherein:
   the at least one additional semiconductor component is an ASIC;
   the front side of the ASIC is connected using bonding pads for electrical connection to the backside of the MEMS component; and electrical connection of the ASIC to the carrier is implemented by through-hole-contacts in the MEMS component.

9. The component as recited in claim 8, wherein the MEMS component and the at least one semiconductor component are at least partially bound in a molding compound such that a further cavity is provided between the diaphragm structure of the MEMS component and the carrier surface.

10. The component as recited in claim 9, wherein the at least one access opening (i) is provided in the molding compound, and (ii) opens out via the through hole of ASIC into the cavity on the backside of the MEMS component.

\* \* \* \* \*